(12) United States Patent
Kume et al.

(10) Patent No.: US 10,943,852 B2
(45) Date of Patent: Mar. 9, 2021

(54) SEMICONDUCTOR DEVICE AND METHOD FOR MANUFACTURING THE SAME

(71) Applicant: TOSHIBA MEMORY CORPORATION, Tokyo (JP)

(72) Inventors: Ippei Kume, Yokkaichi Mie (JP); Taketo Matsuda, Oita Oita (JP); Shinya Okuda, Yokkaichi Mie (JP); Masahiko Murano, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 33 days.

(21) Appl. No.: 16/286,276

(22) Filed: Feb. 26, 2019

(65) Prior Publication Data
US 2019/0363037 A1    Nov. 28, 2019

(30) Foreign Application Priority Data
May 24, 2018 (JP) .............................. JP2018-099669

(51) Int. Cl.
| | | |
|---|---|---|
| *H01L 23/48* | (2006.01) | |
| *H01L 23/532* | (2006.01) | |
| *H01L 23/00* | (2006.01) | |
| *H01L 21/768* | (2006.01) | |

(52) U.S. Cl.
CPC ...... *H01L 23/481* (2013.01); *H01L 21/76831* (2013.01); *H01L 21/76843* (2013.01); *H01L 21/76871* (2013.01); *H01L 21/76898* (2013.01); *H01L 23/53238* (2013.01); *H01L 23/53252* (2013.01); *H01L 23/53266* (2013.01); *H01L 24/13* (2013.01); *H01L 2224/13025* (2013.01)

(58) Field of Classification Search
CPC . H01L 23/481; H01L 24/13; H01L 23/53238; H01L 23/53252; H01L 21/76871; H01L 21/76843; H01L 23/53266
USPC .......................... 257/774, 775; 438/629, 637
See application file for complete search history.

(56) References Cited

U.S. PATENT DOCUMENTS

| | | |
|---|---|---|
| 7,180,191 B2 | 2/2007 | Sasaki et al. |
| 8,501,587 B2 | 8/2013 | Chen et al. |
| 9,064,940 B2 | 6/2015 | Chen |
| 10,024,907 B2 | 7/2018 | Watanabe et al. |

(Continued)

FOREIGN PATENT DOCUMENTS

| | | |
|---|---|---|
| JP | 2013-074275 A | 4/2013 |
| TW | 201445671 A | 12/2014 |
| TW | 201735204 A | 10/2017 |

*Primary Examiner* — Thinh T Nguyen
(74) *Attorney, Agent, or Firm* — Foley & Lardner LLP

(57) ABSTRACT

According to some embodiments, a semiconductor device includes a semiconductor substrate, a metal portion, a first insulating film, and a second insulating film. The semiconductor substrate has a through-hole extending from a first surface of the semiconductor substrate to a second surface thereof opposite to the first surface. The metal portion is formed in the through-hole. The first insulating film is provided on the second surface of the semiconductor substrate and on a side surface of the through-hole. The second insulating film has a dielectric constant of not more than 6.5 and is provided on a metal portion-side surface of the first insulating film on the side surface of the through-hole of the semiconductor substrate.

7 Claims, 5 Drawing Sheets

(56) References Cited

U.S. PATENT DOCUMENTS

2004/0256733 A1   12/2004  Matsuno et al.
2015/0287664 A1   10/2015  Chen
2016/0351492 A1*  12/2016  Watanabe et al. .... H01L 23/528
2018/0019187 A1    1/2018  Lagouge et al.

* cited by examiner

SEMICONDUCTOR DEVICE AND METHOD FOR MANUFACTURING THE SAME

CROSS-REFERENCE TO RELATED APPLICATION

This application claims the benefit of and priority to Japanese Patent Application No. 2018-099669, filed May 24, 2018, the entire contents of which are incorporated herein by reference.

FIELD

Embodiments described herein relate generally to a semiconductor device and a method for manufacturing the semiconductor device.

BACKGROUND

Semiconductor device manufacturing processes using TSV (Through-Silicon Via) include a process (e.g., via-last process) which involves first producing devices (e.g., a semiconductor circuit, etc.) on a semiconductor substrate, and then thinning a Si substrate and forming TSVs. Connection (e.g. connection to another substrate) is made outside the devices through the TSVs. Therefore, while devices are becoming increasingly finer, the need for thinner devices is relatively low regardless of the technology node. Further, since TSVs are formed after the formation of fine devices, which are becoming increasingly difficult to produce these days, the via-last process is unlikely to reduce the device yield.

Since the via-last process requires the steps of bonding a semiconductor substrate to a support substrate with a peelable adhesive, and thinning the Si substrate before forming TSVs, the formation of TSVs needs to be performed at a low temperature.

DETAILED DESCRIPTION

Embodiments provide a semiconductor device having TSVs and a method for manufacturing the semiconductor device which make it possible to prevent the formation of a defect in the device.

In general, according to some embodiments, a semiconductor device may include a semiconductor substrate having a through-hole extending from a first surface of the semiconductor substrate to a second surface thereof opposite to the first surface, a metal portion formed in the through-hole, a first insulating film provided on the second surface of the semiconductor substrate and on the side surface of the through-hole, and a second insulating film having a dielectric constant of not more than 6.5, provided on the metal portion-side surface of the first insulating film on the side surface of the through-hole of the semiconductor substrate.

A semiconductor device and a semiconductor device manufacturing method, according to preferred embodiments, will now be descried in detail with reference to the accompanying drawings. The embodiments are not to be construed as limiting the present disclosure. In the following description, a device-forming surface of a semiconductor substrate as a device-forming object is referred to as a first surface, and a surface opposite the first surface is referred to as a second surface.

Figure 1:
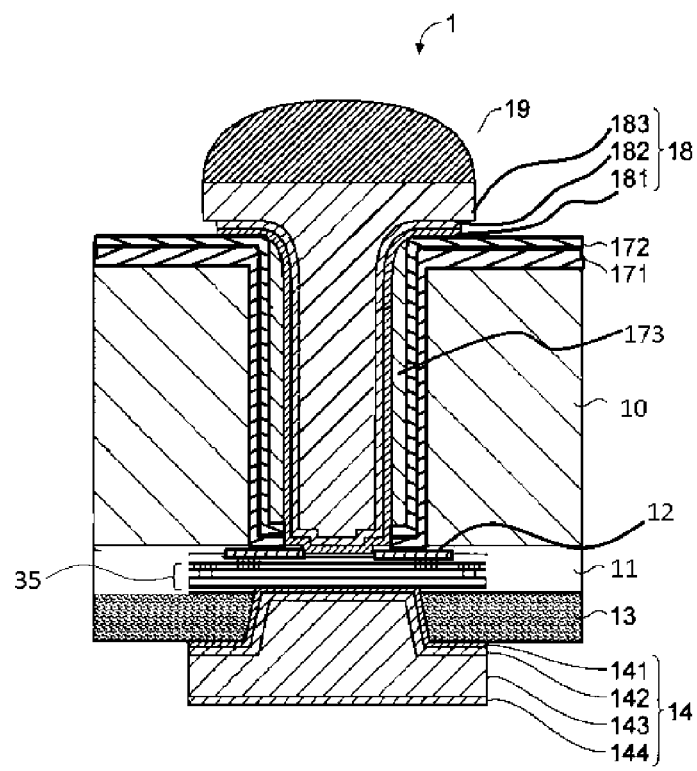
FIG. 1 is a cross-sectional view showing an exemplary schematic structure of a semiconductor device according to some embodiments.

FIG. 1 is a cross-sectional view showing an exemplary schematic structure of a semiconductor device according to some embodiments. As shown in FIG. 1, the semiconductor device 1 includes a semiconductor substrate 10, an insulating layer 11, an STI 12, an insulating layer 13, a first through-via 14, a second through-via 18, and a bonding material (or bump) 19.

The semiconductor substrate 10 is, for example, a silicon substrate. The semiconductor substrate 10 may have been thinned to a thickness of not more than 50 μm (micrometers), for example 30±5 μm.

The first surface (e.g., a surface 101 in FIG. 2) of the semiconductor substrate 10 may have active areas where semiconductor devices are formed, and the STI (Shallow Trench Isolation) 12 which electrically isolates one active area from others. Semiconductor devices (not shown), such as memory cell arrays, transistors, resistive elements, capacitors, etc., may be formed in the active areas. An insulating film such as a silicon oxide film, for example, is used as the STI 12. The first through-via 14 and an interconnect structure 35, which electrically connect a semiconductor device to the second through-via 18, may be provided on the STI 12. The interconnect structure 35, provided on the STI 12, may be electrically connected to a semiconductor device (e.g. a transistor) provided on the first surface of the semiconductor substrate 10. The semiconductor device and the interconnect structure 35 may be covered with the insulating layers 11, 13. The bonding material 19, electrically connected to the second through-via 18, may be provided on the second surface (e.g., a surface 102 in FIG. 2) of the semiconductor substrate 10.

The insulating layer 13 may cover the interconnect structure 35 to protect the interconnect structure 35. The insulating layer 13 may include a passivation layer (not illustrated) that covers the interconnect structure 35, and an organic layer that covers the passivation layer. The passivation layer may be a silicon nitride (SiN) film, a silicon oxide ($SiO_2$) film or a silicon oxynitride (SiON) film, or a stack of two or more such films. A resin material, such as a photosensitive polyimide, may be used for the organic layer.

The first through-via 14 may be in contact with the interconnect structure 35. The first through-via 14 may include a barrier metal layer 141 that covers at least the interior surface of the through-hole (e.g., a through-hole is provided in the insulating layer 13), a seed metal layer 142 on the barrier metal layer 141, and a through-via 143 on the seed metal layer 142. The barrier metal layer 141 may be omitted. A material film 144, which functions upon vertical integration of the semiconductor device 1, may be provided on the through-via 143.

Titanium (Ti), tantalum (Ta), ruthenium (Ru), a combination thereof, or the like may be used for the barrier metal layer 141. Copper (Cu), a stacked nickel/copper (Ni/Cu) film, a combination thereof, or the like may be used for the seed metal layer 142. Nickel (Ni), for example, may be used for the through-via 143. Gold (Au), tin (Sn), copper (Cu), tin-copper (SnCu), tin-gold (SnAu), tin-silver (SnAg), a combination thereof, or the like may be used for the material film 144. The layer structure and the material (s) of the first through-via 14 may be varied. For example, the layer structure and the material of the barrier metal layer 141/the seed metal layer 142 or the material film 144 may be varied appropriately depending on the conductive material or the forming method used for the through-via 143.

The second through-via 18, by its contact with the interconnect structure 35, may electrically lead the interconnect structure 35 onto the second surface of the semiconductor substrate 10.

The second through-via 18 may include a barrier metal layer (first metal layer) 181 that covers at least the interior surface of the through-hole, a seed metal layer (second metal layer) 182 on the barrier metal layer 181, and a through-via or metal portion (third metal layer) 183 on the seed metal layer 182. The metal materials of the respective layers may be the same as the above-described materials usable for the barrier metal layer 141, the seed metal layer 142 and the through-via 143 of the first through-via 14. Voids may be formed in the through-via 183. The bonding material 19 may bond the semiconductor device 1 to another semiconductor device (which is similar to the semiconductor device 1) upon integration of a plurality of semiconductor devices 1 in the vertical direction. Here, the vertical direction refers to the thickness direction of the semiconductor substrate 10. The boding material 19 may be provided on the through-via 183. The bonding material 19 may be tin (Sn), copper (Cu), tin-copper (SnCu), tin-gold (SnAu), tin-silver (SnAg), a combination thereof, or other solder materials.

A silicon oxide film 171 may be provided on the second surface of the semiconductor substrate 10. A first insulating film 172, having a lower hygroscopicity than the silicon oxide film 171, may be provided on the silicon oxide film 171. Thus, the first insulating film 172 may contain less water than the silicon oxide film 171. The first insulating film 172 can thus avoid exposure of the silicon oxide film 171 and, in addition, enhance the moisture-proof effect of the silicon oxide film 171. The first insulating film 172 is, for example, a silicon nitride film preferably having a thickness of not less than 50 nm.

The silicon oxide film 171 may be provided on the side surface of the through-hole formed in the semiconductor substrate 10 and on the second surface of the semiconductor substrate 10. The first insulating film 172 may be provided on the silicon oxide film 171. Thus, the silicon oxide film 171 may be provided between the semiconductor substrate 10 and the first insulating film 172. The first insulating film 172 may be provided on the silicon oxide film 171 in at least inner surface of the through hole. A second insulating film 173 may be provided on the first insulating film 172 in at least inner surface of the through hole. In some embodiments, the second insulating film 173 is not provided on the second surface of the semiconductor substrate 10. The dielectric constant of the second insulating film 173 may be lower than the dielectric constant of the first insulating film 172. The dielectric constant of the second insulating film 173 is preferably not more than 6.5. The thickness of the second insulating film 173 may be larger than the thickness of the silicon oxide film 171. Such second insulating film 173 can enhance the effect of preventing electrical short circuit between the second through-via 18 and the semiconductor substrate 10. The second insulating film 173 may be a film composed mainly of silicon oxide. For example, the second insulating film 173 may be a silicon oxide film.

Figure 2:
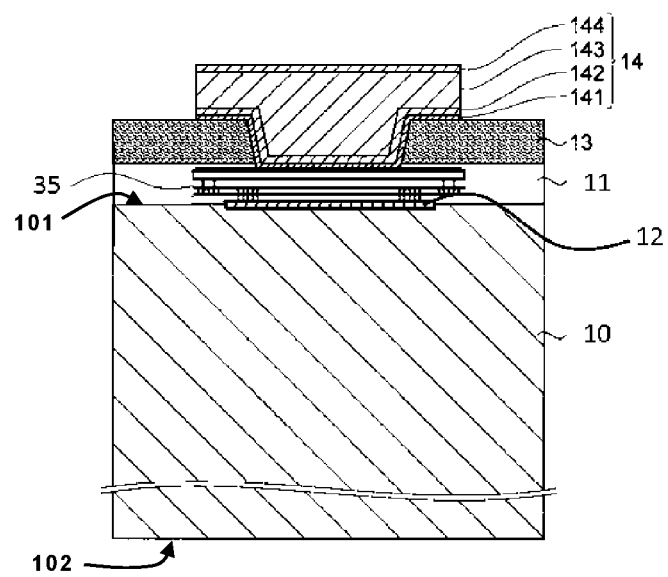
FIG. 2 is a cross-sectional process diagram illustrating a semiconductor device manufacturing method according to some embodiments.

A semiconductor device 1 manufacturing method according to some embodiments will now be descried in detail with reference to the relevant drawings. FIG. 2 through FIG. are cross-sectional process diagrams illustrating the semiconductor device manufacturing method according to some embodiments. FIG. 2 through FIG. 8 use the same cross-section as that of FIG. 1. However, in FIG. 2, for the convenience of illustration, the vertical positional relationship is opposite to that in FIG. 1 and FIG. 3 through FIG. 8.

First, as shown in FIG. 2, STIs 12 may be formed on the first surface (e.g., the surface 101) of a semiconductor substrate 10 to define active areas (not drawn). The semiconductor substrate 10 is, for example, a silicon substrate. Each STI 12 is, for example, a silicon oxide film. Next, semiconductor devices (not shown) may be formed in the active areas. The semiconductor devices may be, for example, memory cell arrays, transistors, resistive elements, capacitors, etc. Upon the formation of the semiconductor devices, an interconnect structure 35, for example, is formed on each STI 12. The semiconductor device and the interconnect structure 35 may be covered with insulating layers 11, 13. The insulating layer 13 may comprise a passivation layer (not illustrated) that covers the interconnect structure 35, and an organic layer that covers the passivation layer. A photosensitive polyimide, for example, is used for the organic layer. An opening pattern for forming a first through-via 14 may be transferred to the organic layer. The opening size of the opening pattern may be, for example, about 10 μm.

Next, the passivation layer of the insulating layer 13 and the insulating layer 11 may be etched away using the organic layer, for example, as a mask, thereby exposing the interconnect structure 35. The etching of the passivation layer and the insulating layer 11 may be performed e.g. by reactive ion etching (RIE). Subsequently, a barrier metal layer of titanium (Ti) and a seed metal layer of copper (Cu) may be sequentially formed on the entire surface, including the interior surface of the through-hole, of the insulating layer 13. The formation of the barrier metal layer and the formation of the seed metal layer may each be performed e.g., by using a sputtering process or a chemical vapor deposition (CVD) process. The thickness of the seed metal layer may be, for example, about 500 nm.

Next, a mask for forming a through-via 143 on the seed metal layer may be formed by using, for example, a PEP (Photo-Engraving Process) technique. In some embodiments, an opening has been formed in the mask at a position corresponding to the through-hole formed in the insulating layer 13. Subsequently, the through-via 143 of nickel (Ni) may be formed on the seed metal layer exposed through the opening of the mask. The formation of the through-via 143 may be performed e.g., by conformal plating.

Next, after removing the mask, the exposed seed metal layer and the barrier metal layer may be removed. Patterning of the seed metal layer 142 and the barrier metal layer 141 under the through-via 143 may be performed in this manner. The patterning of the seed metal layer 142 and the barrier metal layer 141 may be performed by wet etching.

Next, a material film 144 of gold (Au) may be formed on the upper surface of the through-via 143. The formation of the material film 144 may be performed, for example, by using a liftoff process. As a result, as shown in FIG. 2, a first through-via 14, which electrically leads the interconnect structure 35 onto the insulating layer 13, is formed on the device-forming surface (e.g., first surface 101) side of the semiconductor substrate 10.

Figure 3:
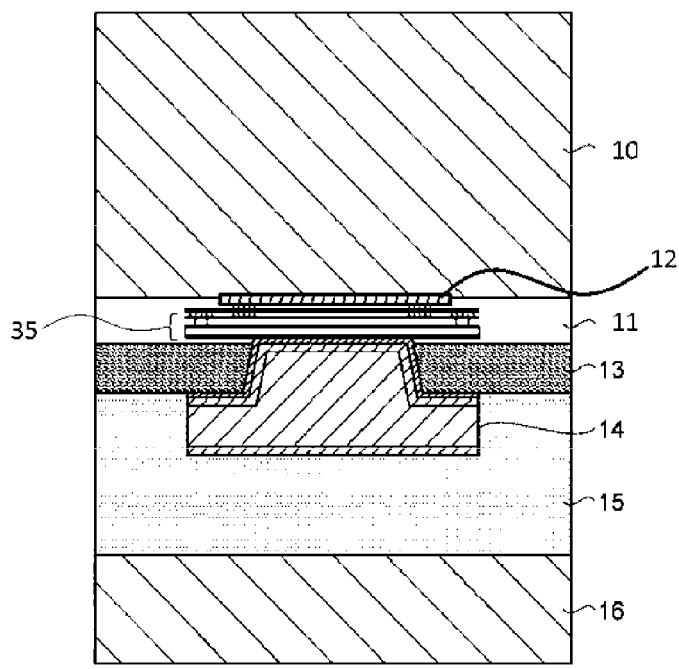
FIG. 3 is a cross-sectional process diagram illustrating the semiconductor device manufacturing method according to some embodiments.

Next, as shown in FIG. 3, an adhesive 15 may be applied to the insulating layer 13 in which the first through-via 14 has been formed. A support substrate 16 may be then attached to the adhesive 15, thereby bonding the support substrate 16 to the device-forming surface of the semiconductor device 1 as shown in FIG. 3. Subsequently, while keeping the support substrate 16 fixed on a stage, the second surface 102 of the semiconductor substrate 10, opposite to the device-forming surface (first surface 101), may be ground to thin the semiconductor substrate 10 to a thickness of, for example, 30±5 μm.

Figure 4:
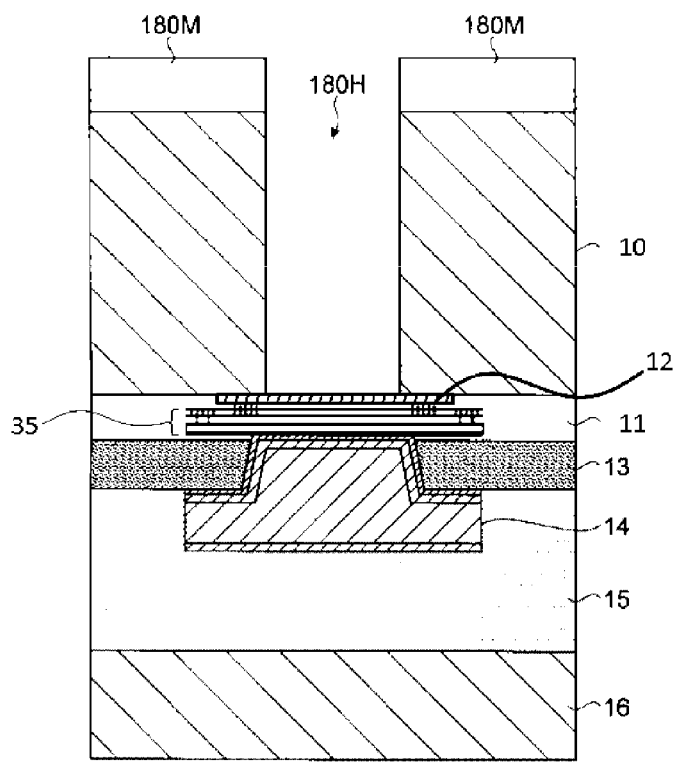
FIG. 4 is a cross-sectional process diagram illustrating the semiconductor device manufacturing method according to some embodiments.

Next, as shown in FIG. 4, a photosensitive photoresist 180M may be applied to the semiconductor substrate 10, and an opening pattern for forming a second through-via 18 may be transferred to the photoresist 180M. The opening size of the opening pattern may be, for example, about 10 μm. Subsequently, using the photoresist 180M, having the transferred opening pattern, as a mask, the second surface 102 of the semiconductor substrate 10 may be drilled to form a through-hole 180H that reaches to the interconnect structure 35. The through-hole 180H may penetrate the semiconductor substrate 10 and open to the first and second surfaces of the semiconductor substrate 10. The drilling of the semiconductor substrate 10 may be performed, for example, by anisotropic dry etching which can achieve a high aspect ratio.

Figure 5:
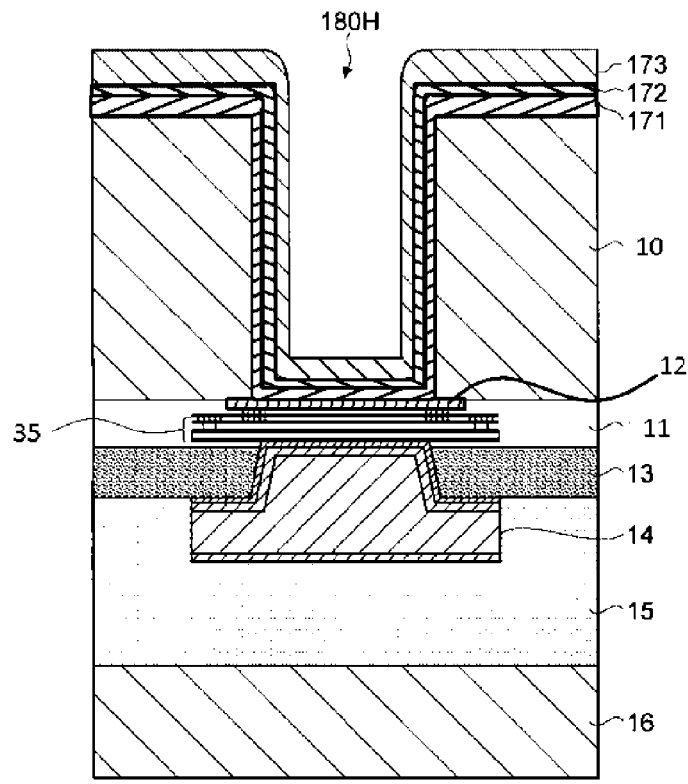
FIG. 5 is a cross-sectional process diagram illustrating the semiconductor device manufacturing method according to some embodiments.

Next, as shown in FIG. 5, a silicon oxide film 171 may be formed on the entire second surface, including the interior surface of the through-hole 180H, of the semiconductor substrate 10. The formation of the silicon oxide film 171 may be performed by using, for example, a CVD process. The silicon oxide film 171 is preferably formed at a temperature of not more than 150° C. When the silicon oxide film 171 is formed at a temperature higher than 150° C., the support substrate 16 may be separated from the first through-via 14 and the insulating layer 13 due to deterioration of the adhesive 15. Subsequently, a first insulating film 172 and a second insulating film 173 may be sequentially formed on the silicon oxide film 171 under the same temperature condition by using, for example, a CVD process. The first insulating film 172 may be a film having a lower hygroscopicity than the silicon oxide film 171 and may be, for example, a silicon nitride film. The second insulating film 173 may be a film having a lower dielectric constant than the first insulating film 172. The dielectric constant of the second insulating film 173 is preferably not more than 6.5. When the dielectric constant of the second insulating film 173 is more than 6.5, the second through-via 18 (see FIG. 1) and the semiconductor substrate 10 may be short-circuited. That is, by having the dielectric constant of the second insulating film 173 not more than 6.5, the effect of preventing electrical short circuit between the second through-via 18 and the semiconductor substrate 10 can be enhanced.

The present inventors conducted an experiment to determine an Si—OH bonding amount relative to an Si—O bonding amount in silicon oxide films formed at 150° C. and at 400° C.

Figures 9A, 9B:
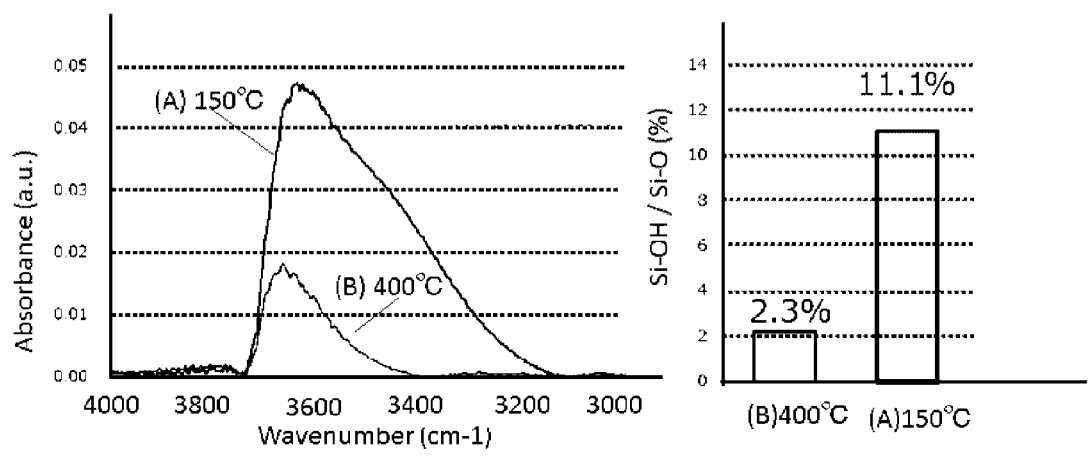
FIG. 9A and FIG. 9B are diagrams showing the results of measurement performed on silicon oxide films which have been heat-treated at different temperatures.

FIG. 9A shows the results of measurement performed on silicon oxide films which have been heat-treated at the different temperatures. FIG. 9B shows analytical results obtained from the data of FIG. 9A. The analytical results of FIG. 9B are obtained from the peak intensity ratio between the Si—OH bond and the Si—O bond contained in each silicon oxide film, shown in FIG. 9A. As shown in FIG. 9A, the peak intensity of the Si—OH bond of the silicon oxide film (A) which has been formed at 150° C. is higher than the peak intensity of the Si—OH bond of the silicon oxide film (B) which has been formed at 400° C. As shown in FIG. 9B, the Si—OH/Si—O bonding amount ratio in the silicon oxide film (B) which has been formed at 400° C. is 2.3%, while the Si—OH/Si—O bonding amount ratio in the silicon oxide film (A) which has been formed at 150° C. is 11.1%. Thus, the Si—OH/Si—O bonding amount ratio in the silicon oxide film (A) is not less than 5% and not more than 15%. This indicates that the silicon oxide film (A) which has been formed at 150° C. contains more Si—OH bonds than the silicon oxide film (B) which has been formed at 400° C. Since Si—OH easily forms a hydrogen bond with an H atom, the silicon oxide film (A) which has been formed at 150° C. tends to contain more water than the silicon oxide film (B) which has been formed at 400° C. The silicon oxide film (A) which has been formed at 150° C. is likely to swell due to absorption of a significant amount of water. A crack (or similar defect) will be formed in the silicon oxide film (A) when it swells to a certain extent. It is possible to subject the silicon oxide film (A), which has been formed at 150° C., to heat treatment at 400° C., thereby reducing the Si—OH/Si—O bonding amount ratio to a level of not more than 3%. Thus, as with the case of forming a silicon oxide film at 400° C., this method can produce a silicon oxide film having a low hygroscopicity.

In some embodiments, the first insulating film 172, having a lower hygroscopicity than the silicon oxide film 171, may be formed on the silicon oxide film 171 which has been formed on the second surface of the semiconductor substrate 10. The first insulating film 172 may be either a silicon nitride film as described above, or a silicon oxide film which has been formed at 400° C. based on the results shown in FIG. 9A and FIG. 9B. The first insulating film 172 can avoid exposure of the silicon oxide film 171 and prevents the silicon oxide film 171 from swelling and forming a crack. The prevention of the formation of a crack in the silicon oxide film 171 can increase the yield of the semiconductor device.

Figure 6:
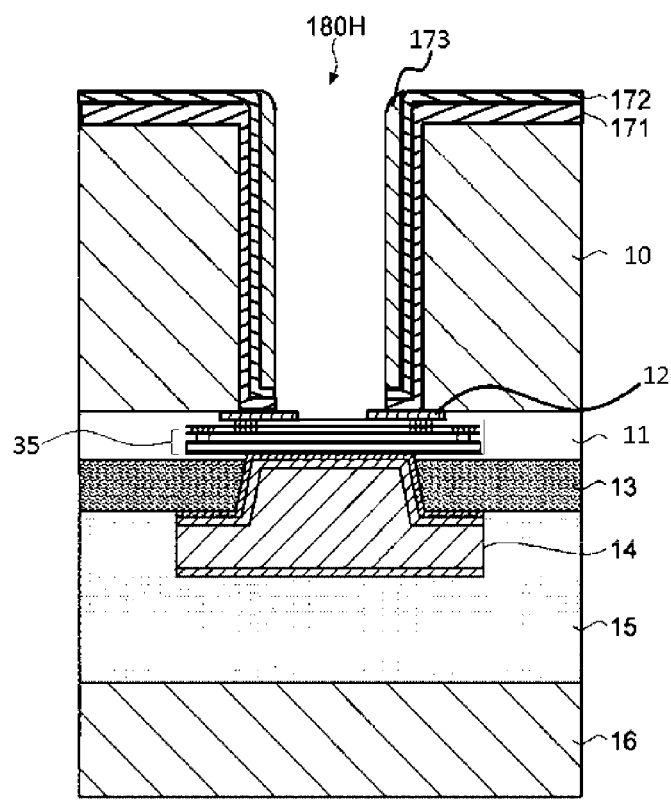
FIG. 6 is a cross-sectional process diagram illustrating the semiconductor device manufacturing method according to some embodiments.

Next, as shown in FIG. 6, the STI 12, formed at the bottom of the through-hole 180H, may be removed by etching back the STI 12 by RIE. The etching back may be performed until the STI 12 is removed and the interconnect structure 35 becomes exposed. The second insulating film 173, formed on the second surface of the semiconductor substrate 10, may be also removed by RIE. As a result, the first insulating film 172 becomes exposed on the second surface of the semiconductor substrate 10, while the side surface of the through-hole 180H is covered with the second insulating film 173 formed on the first insulating film 172, and the interconnect structure 35 becomes exposed at the bottom of the through-hole 180H.

Figure 7:
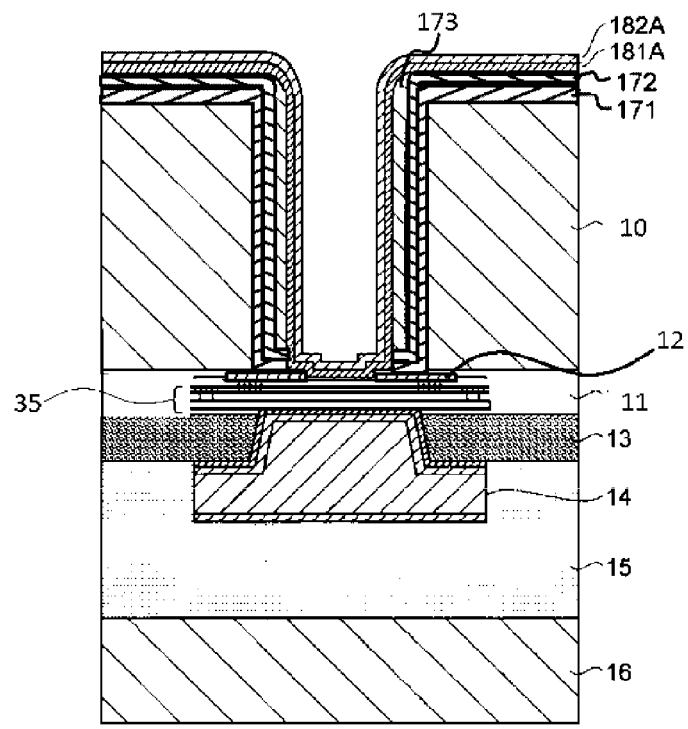
FIG. 7 is a cross-sectional process diagram illustrating the semiconductor device manufacturing method according to some embodiments.

Next, as shown in FIG. 7, a barrier metal layer 181A of titanium (Ti) and a seed metal layer 182A of copper (Cu) may be sequentially formed on the entire surface of the second insulating film 173, including the interior surface of the through-hole. The barrier metal layer 181A and the seed metal layer 182A are sometimes simply termed a metal layer. The thickness of the seed metal layer 182A may be larger than the thickness of the seed metal layer 142.

Figure 8:
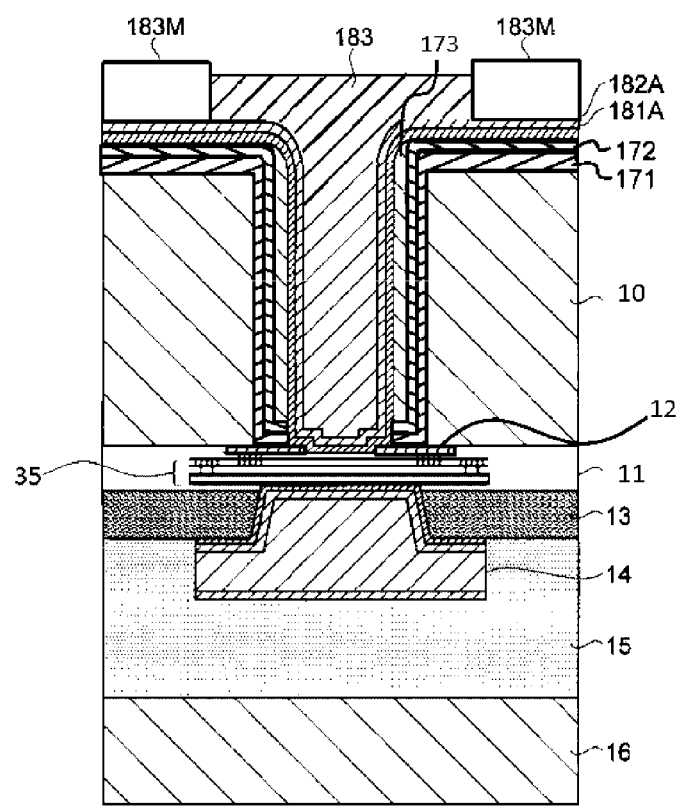
FIG. 8 is a cross-sectional process diagram illustrating the semiconductor device manufacturing method according to some embodiments.

Next, as shown in FIG. 8, a mask 183M for forming a through-via 183 on the seed metal layer 182A may be formed by using, for example, a PEP technique. An opening may be formed in the mask 183M at a position corresponding to the through-hole 180H formed in the semiconductor substrate 10. Subsequently, as shown in FIG. 8, the through-via 183 of nickel (Ni) may be formed on the seed metal layer 182A exposed through the opening of the mask 183M. The formation of the through-via 183 may be performed e.g. by conformal plating.

Next, after removing the mask 183M, the exposed seed metal layer 182A and the barrier metal layer 181A may be removed. The removal of the seed metal layer 182A and the barrier metal layer 181A may be performed by wet etching.

Next, a bonding material 19 (see FIG. 1) may be formed on the upper surface of the through-via 183. The formation of the bonding material 19 may be performed, for example, by electroplating or electroless plating. A second through-via 18 (see FIG. 1), which electrically leads the interconnect structure 35, can be thus formed on the second surface side of the semiconductor substrate 10 through the above process steps, thereby completing the production of the semiconductor device 1 having the cross-sectional structure shown in FIG. 1.

As described hereinabove, according to some embodiments, the first insulating film 172, having a lower hygroscopicity than the silicon oxide film 171, may be formed on the silicon oxide film 171 which has been formed on the second surface of the semiconductor substrate 10. This can avoid exposure of the silicon oxide film 171 and can prevent the formation of a crack in the silicon oxide film 171.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
  a semiconductor substrate having a through-hole extending from a first surface of the semiconductor substrate to a second surface thereof opposite to the first surface;
  a metal portion formed in the through-hole;
  a first insulating film provided on the second surface of the semiconductor substrate and on a side surface of the through-hole; and
  a second insulating film having a dielectric constant of not more than 6.5, only provided on a metal portion-side surface of the first insulating film on the side surface of the through-hole of the semiconductor substrate.

2. The semiconductor device according to claim 1, wherein a Si—OH/Si—O bonding amount ratio in the first insulating film is lower than a Si—OH/Si—O bonding amount ratio in the second insulating film.

3. The semiconductor device according to claim 1, wherein the first insulating film is a silicon nitride film.

4. The semiconductor device according to claim 1, wherein the second insulating film is a silicon oxide film.

5. The semiconductor device according to claim 1, further comprising
  a third insulating film provided (1) between the second surface of the semiconductor substrate and the first insulating film on the second surface of the semiconductor substrate and (2) between the side surface of the through-hole and the first insulating film on the side surface of the through-hole.

6. The semiconductor device according to claim 5, wherein
  a thickness of the third insulating film at a side of through-hole is thinner than a thickness of the second insulating film at a side of through-hole.

7. The semiconductor device according to claim 5, wherein
  wherein the third insulating film is a silicon oxide film.

* * * * *